(12) United States Patent
Hara (10) Patent No.: US 8,159,800 B2
(45) Date of Patent: Apr. 17, 2012

(54) SEMICONDUCTOR DEVICE

(75) Inventor: Kiyohito Hara, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 499 days.

(21) Appl. No.: 12/482,954

(22) Filed: Jun. 11, 2009

(65) Prior Publication Data

US 2009/0323231 A1    Dec. 31, 2009

(30) Foreign Application Priority Data

Jun. 30, 2008    (JP) .................................. 2008-170033

(51) Int. Cl.
*H02H 7/00* (2006.01)
(52) U.S. Cl. ...................................... 361/93.7
(58) Field of Classification Search .................. 361/93.7
See application file for complete search history.

(56) References Cited

U.S. PATENT DOCUMENTS

| 7,342,440 B2 * | 3/2008 | Bodano et al. ................ 327/564 |
| 7,550,934 B1 * | 6/2009 | Deng et al. .................... 315/308 |
| 7,880,404 B2 * | 2/2011 | Deng et al. .................... 315/291 |

FOREIGN PATENT DOCUMENTS

| JP | 2006-18663 | 1/2006 |
| JP | 2006-33197 | 2/2006 |

\* cited by examiner

*Primary Examiner* — Stephen W Jackson
(74) *Attorney, Agent, or Firm* — Cooper & Dunham LLP (57) ABSTRACT

In a semiconductor device, low-level signals are output from a terminal voltage detecting circuit when the connection between an external terminal and a resistor is cut off, or when the connection between the resistor and a ground voltage is cut off, or when the external terminal short-circuits to the ground voltage. Accordingly, a PMOS transistor is turned on so that an oscillating circuit stops oscillating and outputs high-level signals from its output terminal.

14 Claims, 7 Drawing Sheets

SEMICONDUCTOR DEVICE

BACKGROUND OF THE INVENTION

1. Field of the Invention

The present invention relates to a semiconductor device provided with a current setting circuit for setting a current used in an internal circuit of the semiconductor device with the use of an external resistor.

2. Description of the Related Art

Figure 8:
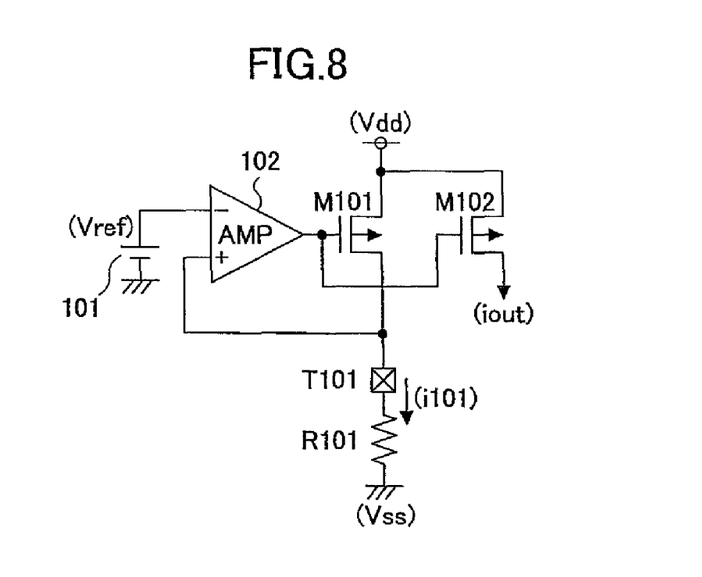
FIG. 8 illustrates a circuit example of a conventional current generating circuit.
Figure 9:
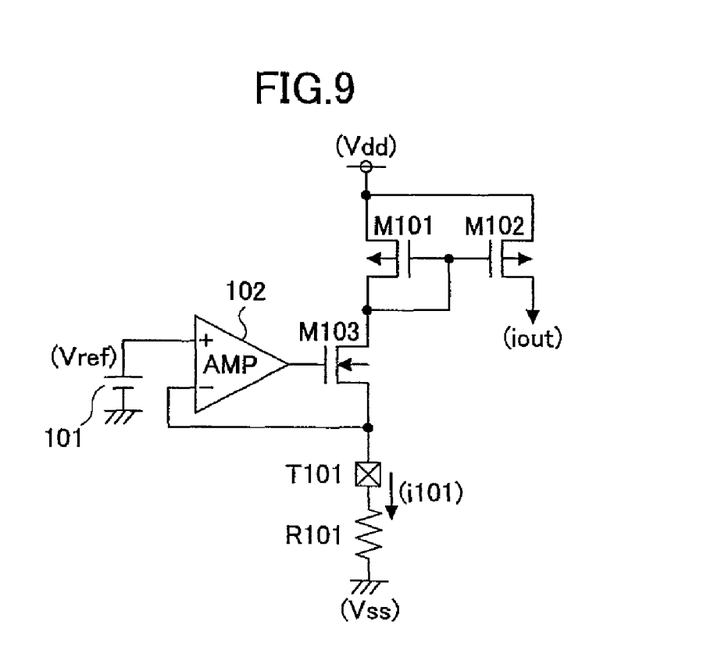
FIG. 9 illustrates another circuit example of a conventional current generating circuit.

Conventionally, a current generating circuit as shown in FIG. 8 (see, for example, patent document 1) or FIG. 9 (see, for example, patent document 2) is used for generating a current necessary for operating an internal circuit of a semiconductor device.

The current generating circuit shown in FIG. 8 includes a reference voltage generating circuit 101 for generating and outputting a reference voltage Vref; an operational amplifying circuit 102; PMOS transistors M101 and M102; and a resistor R101. The operational amplifying circuit 102 controls the gate voltage of the PMOS transistor M101 so that the voltage decline of the resistor R101 becomes equal to the reference voltage Vref. As a result, the resistor R101 receives a current i101 (=Vref/r101) that is determined by the reference voltage Vref and a resistance r101 of the resistor R101. The current i101 is also the drain current of the PMOS transistor M101. The sources and the gates of the PMOS transistors M101 and M102 are connected to each other, and therefore a drain current iout of the PMOS transistor M102 is output as a current proportional to the current i101.

The current generating circuit shown in FIG. 9 includes the reference voltage generating circuit 101, the operational amplifying circuit 102, the PMOS transistors M101 and M102, an NMOS transistor M103, and the resistor R101. The operational amplifying circuit 102 controls the gate voltage of the NMOS transistor M103 so that the voltage decline of the resistor R101 becomes equal to the reference voltage Vref. As a result, the resistor R101 receives a current i101 (=Vref/r101) that is determined by the reference voltage Vref and the resistor R101. The current i101 is also the drain current of the PMOS transistor M101 and the NMOS transistor M103. The PMOS transistors M101 and M102 constitute a current mirror circuit, and therefore the drain current iout of the PMOS transistor M102 is output as a current proportional to the current i101.

The appropriate one of the current generating circuits shown in FIGS. 8 and 9 can be applied in consideration of the reference voltage Vref, a power source voltage Vdd, and the threshold voltage of the MOS transistor to be used.

Furthermore, in a case where the circuit shown in FIG. 8 or 9 is integrated into a semiconductor device for the purpose of freely setting the current value of the current iout, an external terminal T101 can be provided for externally connecting the resistor R101.

Patent Document 1: Japanese Laid-Open Patent Application No. 2006-33197
Patent Document 2: Japanese Laid-Open Patent Application No. 2006-18663

However, when the resistor R101 is externally connected, there may be cases where connection failures occur between the semiconductor device and the circuit board. Consequently, the resistor R101 may become disconnected from the external terminal T101, thus causing the external terminal T101 to be in an open state, or causing the external terminal T101 to become short-circuited to a ground voltage Vss and the power source voltage Vdd.

When the resistor R101 is disconnected from the external terminal T101 such that the external terminal T101 is in an open state, the output current iout may become extremely low or may not be output at all. Accordingly, the circuit to which the current is supplied may malfunction or stop operating, thereby causing unexpected failures in the circuit of the semiconductor device.

Furthermore, when the external terminal T101 short-circuits to the ground voltage Vss, the PMOS transistor M102 that supplies the output current iout is completely turned on, and therefore the output current iout significantly increases. As a result, the load circuit to which the current is supplied may malfunction and overheat. Furthermore, the PMOS transistor M102, which is outputting the output current iout, may overheat and malfunction due to the increased current.

SUMMARY OF THE INVENTION

The present invention provides a semiconductor device in which one or more of the above-described disadvantages are eliminated.

A preferred embodiment of the present invention provides a semiconductor device capable of preventing a circuit from overheating and preventing a load circuit to which a current is supplied from malfunctioning, even in the event that an external terminal becomes open or becomes connected to a ground voltage.

According to an aspect of the present invention, there is provided a semiconductor device including a current generating circuit unit configured to generate and output an output current according to a resistance of a resistor connected to a predetermined external terminal; a load circuit unit to which the output current from the current generating circuit is supplied; and a terminal voltage detecting circuit unit configured to detect a connection state between the external terminal and the resistor based on a voltage of the external terminal, and output a signal according to a result of the detection, wherein the current generating circuit unit controls another current supplied to the resistor through the external terminal and controls the output current, so that the voltage of the external terminal corresponds to a predetermined first reference voltage; and the terminal voltage detecting circuit unit detects whether a voltage difference between the voltage of the external terminal and the first reference voltage is less than or equal to a predetermined value, and stops an operation of the load circuit unit in the event that the voltage difference exceeds the predetermined value.

According to an aspect of the present invention, there is provided a semiconductor device including a current generating circuit unit configured to generate and output an output current according to a resistance of a resistor connected to a predetermined external terminal; a load circuit unit to which the output current from the current generating circuit is supplied; and a terminal voltage detecting circuit unit configured to detect a connection state between the external terminal and the resistor based on a voltage of the external terminal, and output a signal according to a result of the detection, wherein the current generating circuit unit controls another current supplied to the resistor through the external terminal and controls the output current, so that the voltage of the external terminal corresponds to a predetermined first reference voltage; and the terminal voltage detecting circuit unit detects whether a voltage difference between the voltage of the external terminal and the first reference voltage is less than or equal to a predetermined value, and in the event that the terminal voltage detecting circuit unit detects that the voltage difference between the voltage of the external terminal and the first reference voltage exceeds the predetermined value, the current generating circuit unit stops supplying the output current to the load circuit unit.

According to one embodiment of the present invention, a semiconductor device is provided, which is capable of preventing a current generating circuit unit and/or a load circuit unit from malfunctioning or overheating so that failures are prevented from occurring in these circuits, even in the event that an external terminal becomes open or short-circuited to a ground voltage, whereby the external terminal is for connecting the semiconductor device to an external resistor used for specifying a current.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given, with reference to the accompanying drawings, of embodiments of the present invention.

First Embodiment

Figure 1:
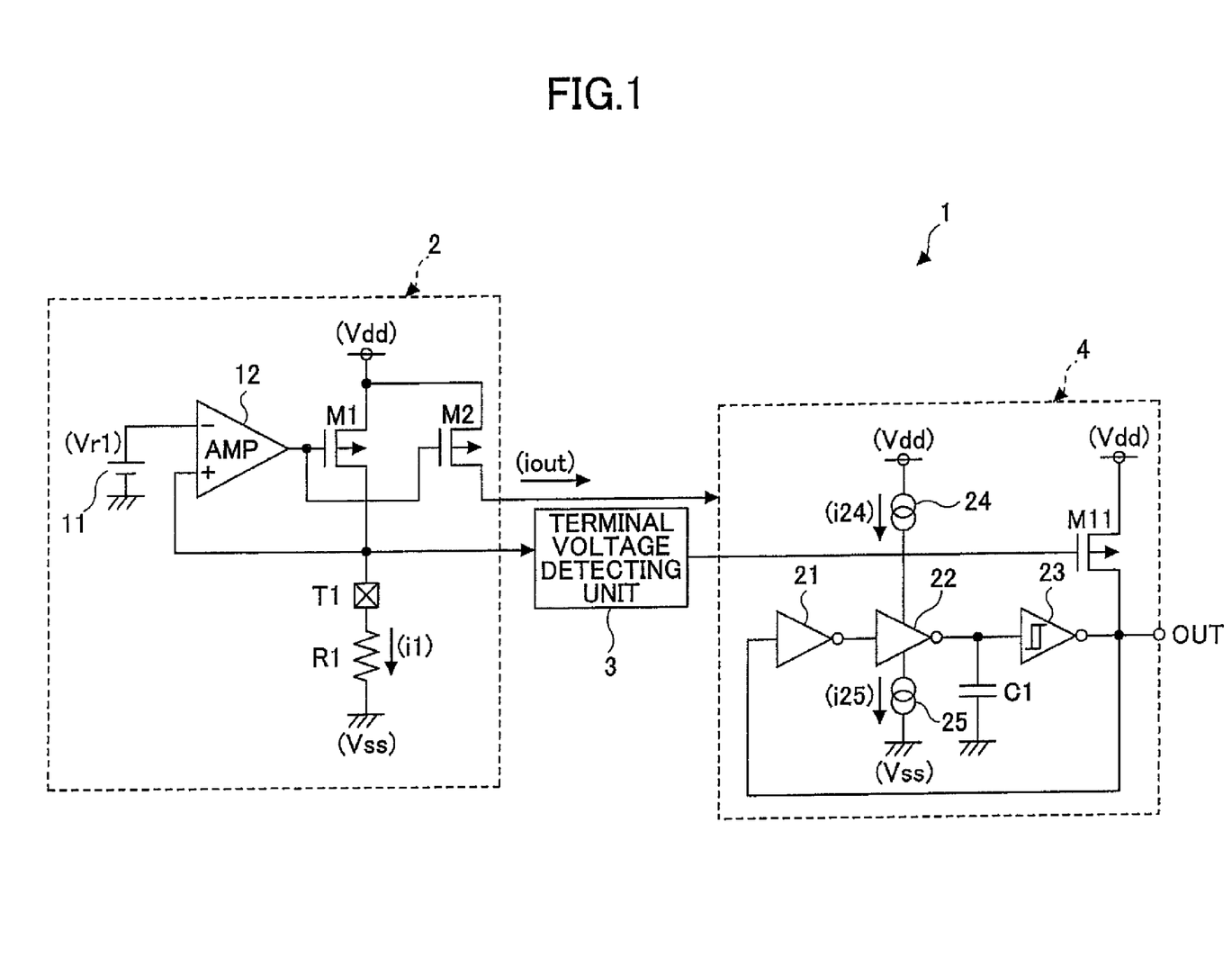
FIG. 1 illustrates a circuit example of a semiconductor device according to a first embodiment of the present invention.

FIG. 1 illustrates a circuit example of a semiconductor device according to a first embodiment of the present invention.

A semiconductor device 1 shown in FIG. 1 includes a current generating circuit 2 for generating a current to be used inside the semiconductor device 1 constituting an IC and outputting the generated current as an output current iout; a terminal voltage detecting circuit 3 for detecting the voltage of an external terminal T1 of the IC; and an oscillating circuit 4 to which the output current iout is supplied, constituting a load circuit of the current generating circuit 2. The current generating circuit 2 constitutes a current generating circuit unit; the terminal voltage detecting circuit 3 constitutes a terminal voltage detecting circuit unit; and the oscillating circuit 4 constitutes a load circuit unit.

The current generating circuit 2 includes a first reference voltage generating circuit 11 for generating and outputting a predetermined first reference voltage Vr1; an operational amplifying circuit 12; PMOS transistors M1 and M2; and a resistor R1. The resistor R1 is externally connected to the IC constituting the semiconductor device 1.

The PMOS transistor M1 is connected between a power source voltage Vdd and the external terminal T1, and the resistor R1 is connected between the external terminal T1 and a ground voltage Vss. The first reference voltage Vr1 is input to the inverting input terminal of the operational amplifying circuit 12. The noninverting input terminal of the operational amplifying circuit 12 is connected to the drain of the PMOS transistor M1, and also to one of the terminals of the resistor R1 through the external terminal T.

The output terminal of the operational amplifying circuit 12 is connected to the gates of the PMOS transistors M1 and M2. The source of the PMOS transistor M2 is connected to the power source voltage Vdd. The output current iout is output from the drain of the PMOS transistor M2, a current i1 that is proportional to the output current iout is output from the drain of the PMOS transistor M1, and the current i1 flows to the resistor R1 through the external terminal T1. The current value of the output current iout can be changed by changing the resistance of the resistor R1. The resistor R1 is for setting the current value of the output current iout.

The voltage of the external terminal T1 is input to the terminal voltage detecting circuit 3. The terminal voltage detecting circuit 3 detects whether the voltage difference between the voltage of the external terminal T1 and the first reference voltage Vr1 is less than or equal to a predetermined value, and outputs a signal indicating the detection result.

The oscillating circuit 4 includes inverters 21 and 22; a hysteresis inverter 23; current sources 24 and 25; a capacitor C1; and a PMOS transistor M11. The current source 24 is connected between the power source voltage Vdd and the positive power source input terminal of the inverter 22, and the current source 25 is connected between the negative power source input terminal of the inverter 22 and the ground voltage Vss.

The current sources 24 and 25 generate and output currents i24 and i25, respectively, which are proportional to the output current iout of the current generating circuit 2, although such connections (between the currents i24, i25 and the output current iout) are not illustrated in the figure. The capacitor C1 is connected between the output terminal of the inverter 22 and the ground voltage Vss; the output terminal of the inverter 22 is connected to the input terminal of the hysteresis inverter 23; and the input terminal of the inverter 22 is connected to the output terminal of the inverter 21. The output terminal of the hysteresis inverter 23 is connected to the input terminal of the inverter 21, and the connection part therebetween constitutes an output terminal OUT of the oscillating circuit 4. Furthermore, the PMOS transistor M11 is connected between a power source voltage Vdd and the output terminal OUT, and output signals from the terminal voltage detecting circuit 3 are input to the gate of the PMOS transistor M11. The capacitor C1 is charged by the current i24 from the current source 24, and is discharged by the current i25 from the current source 25.

Figure 2:
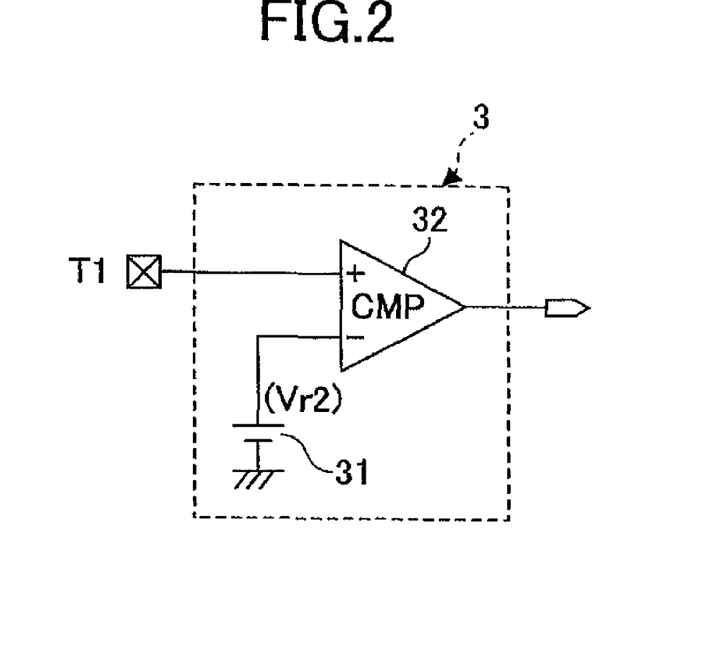
FIG. 2 illustrates a circuit example of a terminal voltage detecting circuit.
Figure 3:
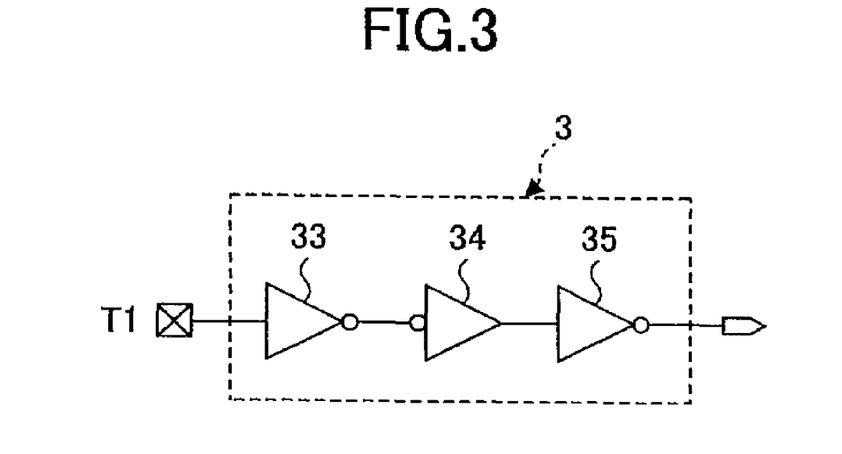
FIG. 3 illustrates another circuit example of the terminal voltage detecting circuit.
Figure 4:
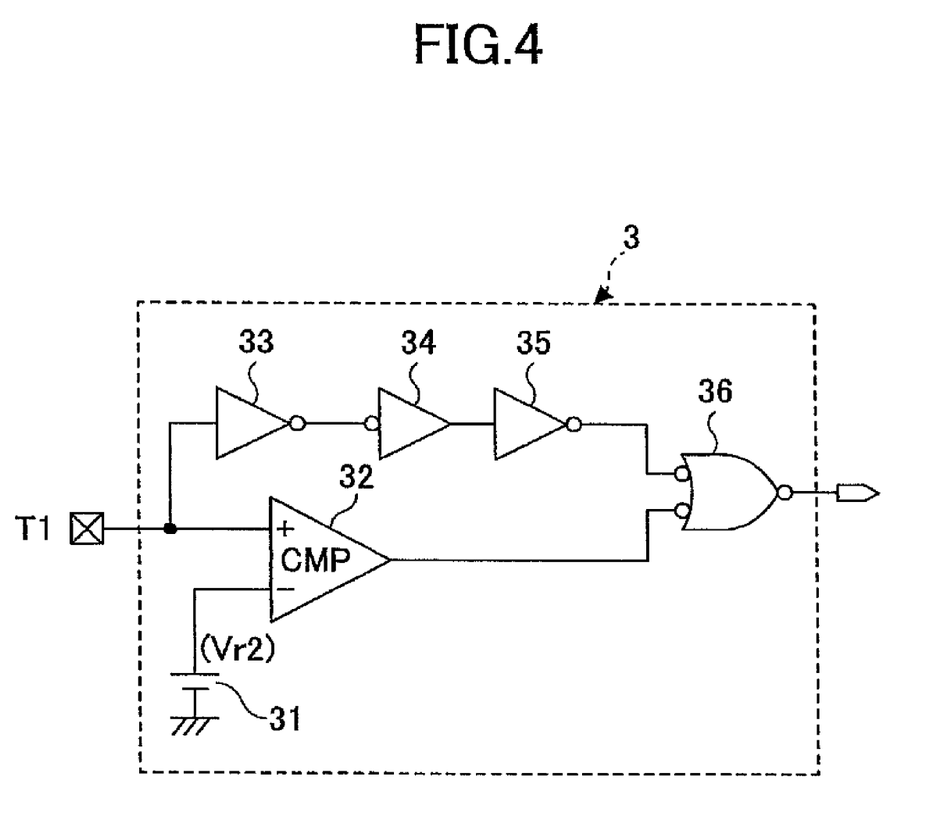
FIG. 4 illustrates yet another circuit example of the terminal voltage detecting circuit.

FIGS. 2 through 4 illustrate circuit examples of the terminal voltage detecting circuit 3.

In the circuit shown in FIG. 2, the terminal voltage detecting circuit 3 includes a second reference voltage generating circuit 31 for generating and outputting a predetermined second reference voltage Vr2, and a comparator 32. The noninverting input terminal of the comparator 32 is connected to the external terminal T1, the second reference voltage Vr2 is input to the noninverting input terminal of the comparator 32, and the output terminal of the comparator 32 constitutes an output terminal of the terminal voltage detecting circuit 3. By setting the second reference voltage Vr2 to be lower than the first reference voltage Vr1 by a predetermined voltage, it can be detected whether the voltage of the external terminal T1 is lower than the first reference voltage Vr1 by the predetermined voltage, i.e., whether the voltage difference between the voltage of the external terminal T1 and the first reference voltage Vr1 is less than or equal to the predetermined value.

Conversely, by setting the second reference voltage Vr2 to be higher than the first reference voltage Vr1 by a predetermined voltage, it can be detected whether the voltage of the external terminal T1 is higher than the first reference voltage Vr1 by the predetermined voltage, i.e., whether the voltage difference between the voltage of the external terminal T1 and the first reference voltage Vr1 is less than or equal to the predetermined value. In the circuit shown in FIG. 2, the external terminal T1 is connected to the noninverting input terminal of the comparator 32, and the second reference voltage Vr2 is input to the inverting input terminal of the comparator 32, which is one example. The connections to the input terminals may be reversed, depending on whether the output level of the comparator 32 is high or low when performing the detection.

In the circuit shown in FIG. 3, the terminal voltage detecting circuit 3 includes three inverters 33 through 35 that are connected in series. An input terminal of the inverter 33 is connected to the external terminal T1, and an output terminal of the inverter 35 constitutes the output terminal of the terminal voltage detecting circuit 3. When an input threshold voltage of the inverter 33 is higher than the first reference voltage Vr1, it can be detected whether the voltage of the external terminal T1 is higher than the first reference voltage Vr1. Conversely, when the input threshold voltage of the inverter 33 is lower than the first reference voltage Vr1, it can be detected whether the voltage of the external terminal T1 is lower than the first reference voltage Vr1. That is, it can be detected whether the voltage difference between the external terminal T1 and the first reference voltage Vr1 is less than or equal to a predetermined value. The number of serially-connected inverters is not limited to three. The terminal voltage detecting circuit 3 may only include the inverter 33 if the inverter 33 has a large gain. In accordance with the output logic of the terminal voltage detecting circuit 3 when performing the detection, the number of inverters may be an even number. The circuit shown in FIG. 3 is low-cost, and is therefore appropriate for cases where the voltage detection of the external terminal T1 does not require high precision.

The circuit shown in FIG. 4 is formed by combining together the circuits shown in FIGS. 2 and 3. The output signals from both circuits are input to corresponding input terminals of an AND circuit 36 of a negative logic. An output terminal of the AND circuit 36 constitutes the output terminal of the terminal voltage detecting circuit 3. The circuit shown in FIG. 4 is capable of detecting a case where the voltage of the external terminal T1 is higher than the first reference voltage Vr1 and a case where the voltage of the external terminal T1 is lower than the first reference voltage Vr1. The second reference voltage Vr2 is lower than the first reference voltage Vr1 by the above-described predetermined voltage. When the voltage of the external terminal T1 is lower than the second reference voltage Vr2, the comparator 32 outputs a low-level signal, and the low-level signal is output through the AND circuit 36.

Meanwhile, the input threshold voltage of the inverter 33 is higher than the first reference voltage Vr1. Thus, when the voltage of the external terminal T1 is higher than or equal to the input threshold voltage of the inverter 33, the output signals from the inverter 33 become low-level, and the output signals from the inverter 35 become low-level. The low-level signals are output through the AND circuit 36. Depending on the purpose, the output signals from the comparator 32 for detecting the low voltage side, and the output signals from the comparator 35 for detecting the high voltage side, may be output separately from the terminal voltage detecting circuit 3.

The terminal voltage detecting circuit 3 may be configured such that the second reference voltage Vr2 is higher than the first reference voltage Vr1 to detect the high voltage side with the comparator 32, and such that the input threshold voltage of the inverter 33 is lower than the first reference voltage Vr1 to detect the lower voltage side with the inverter 33.

Furthermore, the detection of the low voltage side and the detection of the high voltage side may be performed with separate comparators by using two reference voltages, i.e., the second reference voltage Vr2 which is lower than the first reference voltage Vr1, and a third reference voltage Vr3 which is higher than the first reference voltage Vr1.

In such a configuration, assuming that r1 is the resistance of the resistor R1, and that the resistor R1 is normally connected between the external terminal T1 and the ground voltage Vss, the current i1 flowing to the resistor R1 is obtained by i1=Vr1/r1, and the output current iout from the current generating circuit 2 becomes proportional to the current i1. Accordingly, the voltage of the external terminal T1 becomes equal to the first reference voltage Vr1. In a case where the circuit shown in FIG. 4 is used as the terminal voltage detecting circuit 3, when the voltage of the external terminal T1 is substantially equal to the first reference voltage Vr1, the input terminal of the inverter 33 becomes low-level, the output terminal of the inverter 35 becomes high-level, the output terminal of the comparator 32 becomes high-level, and the AND circuit 36 outputs high-level signals. Accordingly, the PMOS transistor M1 of the oscillating circuit 4 is turned off and switched to a cutoff state, so as not to affect the oscillating operation of the oscillating circuit 4. The output current iout is supplied to the oscillating circuit 4 which is the load circuit, so that the output current iout is used for charging/discharging the capacitor C1. Accordingly, the oscillating frequency of the oscillating circuit 4 increases as the output current iout increases, and the oscillating frequency of the oscillating circuit 4 decreases as the output current iout decreases.

When the connection between the external terminal T1 and the resistor R1 is cut off, or when the connection between the resistor R1 and the ground voltage Vss is cut off, the voltage of the external terminal T1 exceeds the first reference voltage Vr1 and approaches the power source voltage Vdd. Accordingly, the input terminal of the inverter 33 becomes high-level, and the output signals from the inverter 35 become low-level. Thus, although the output signals from the comparator 32 are high-level, the output signals from the inverter 35 are low-level, and therefore the output signals from the AND circuit 36 become low-level. Therefore, the PMOS transistor M11 of the oscillating circuit 4 is turned on, the output signals from the hysteresis inverter 23 become high-level, and the oscillating circuit 4 stops oscillating and outputs high-level signals from its output terminal.

When the external terminal T1 short-circuits to the ground voltage Vss, the input terminal of the inverter 33 becomes low-level, and the output terminal of the inverter 35 becomes high-level. However, as the output signals from the comparator 32 become low-level, the output signals from the AND circuit 36 become low-level. Accordingly, the PMOS transistor M11 of the oscillating circuit 4 is turned on, and the oscillating circuit 4 stops oscillating and outputs high-level signals from the output terminal OUT as described above.

Accordingly, the semiconductor device 1 according to the first embodiment of the present invention stops operating the oscillating circuit 4 in the event that the resistor R1 is disconnected from the external terminal T1 or the external terminal T1 short-circuits to the ground voltage Vss. Therefore, the oscillating circuit 4 is prevented from performing unspecified operations which may lead to damages in the oscillating circuit 4 or other circuits.

Second Embodiment

In the first embodiment, the oscillating circuit 4 stops operating according to output signals from the terminal voltage detecting circuit 3. In another configuration, when the oscillating circuit 4 stops operating, the current generating circuit 2 can stop outputting the output current iout. A second embodiment of the present invention has such a configuration.

Figure 5:
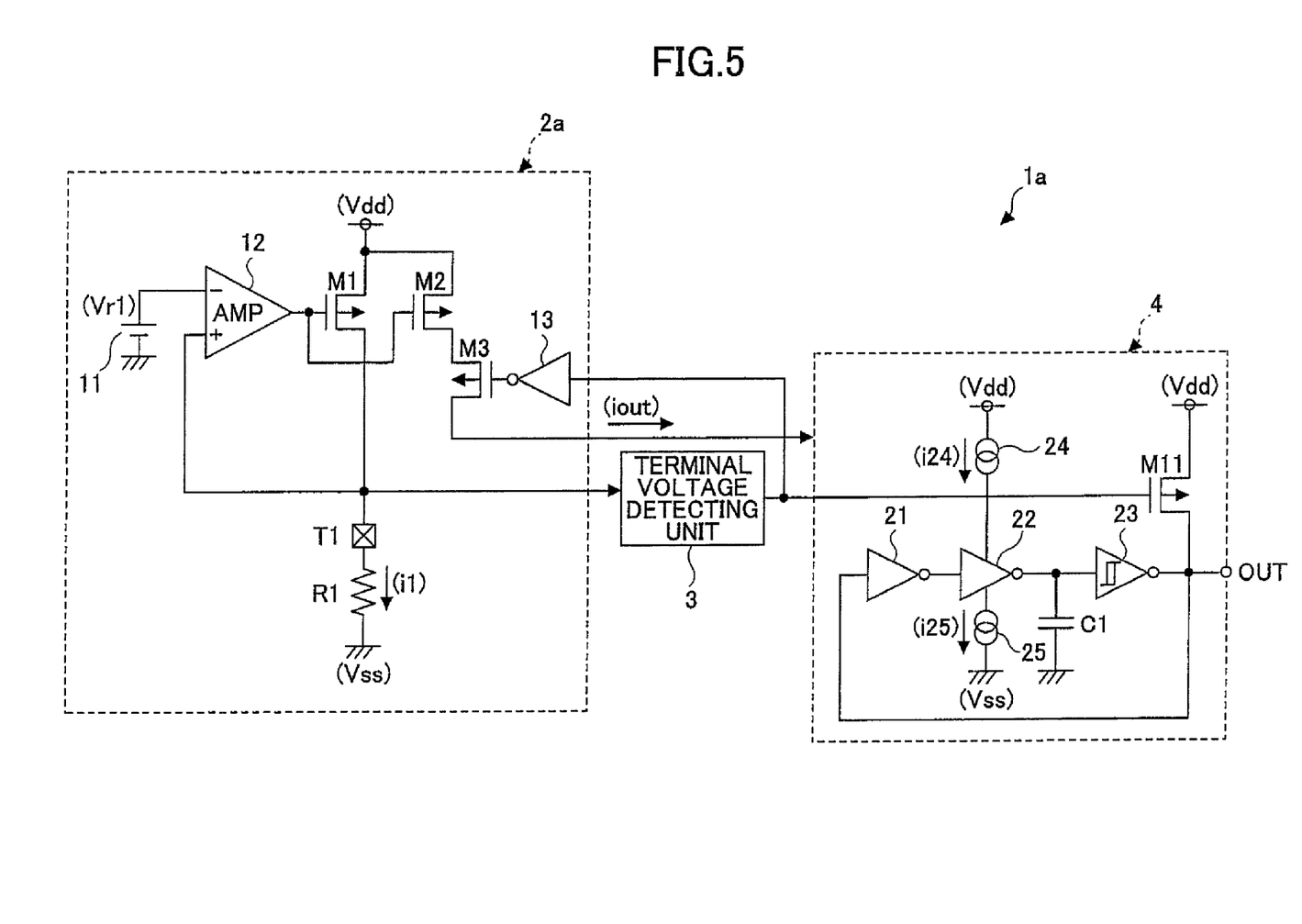
FIG. 5 illustrates a circuit example of a semiconductor device according to a second embodiment of the present invention.

FIG. 5 illustrates a circuit example of a semiconductor device according to the second embodiment of the present invention. In FIG. 5, elements corresponding to those in FIG. 1 are denoted by the same reference numbers, and are not further described. Only the differences between FIGS. 1 and 5 are described.

The differences between FIGS. 1 and 5 are that in FIG. 5, a PMOS transistor M3 and an inverter 13 are additionally provided in the current generating circuit 2 shown in FIG. 1. Therefore, the current generating circuit 2 shown in FIG. 1 is changed to a current generating circuit 2a in FIG. 5, and the semiconductor device 1 shown in FIG. 1 is changed to a semiconductor device 1a in FIG. 5.

The semiconductor device 1a shown in FIG. 5 includes the current generating circuit 2a for generating a current to be used inside the semiconductor device 1a constituting an IC and outputting the generated current as the output current iout; the terminal voltage detecting circuit 3; and the oscillating circuit 4 to which the output current iout is supplied, constituting a load circuit of the current generating circuit 2a. The current generating circuit 2a constitutes a current generating circuit unit.

The current generating circuit 2a includes the first reference voltage generating circuit 11, the operational amplifying circuit 12, the inverter 13, the PMOS transistors M1 through M3, and the resistor R1. The resistor R1 is externally connected to the semiconductor device 1a.

The drain of the PMOS transistor M2 is connected to the source of the PMOS transistor M3, and the output current iout is output from the drain of the PMOS transistor M3. That is, the output current iout output from the drain of the PMOS transistor M2 is output to the oscillating circuit 4 through the PMOS transistor M3. The output signals from the terminal voltage detecting circuit 3 are input to the gate of the PMOS transistor M3 through the inverter 13.

In such a configuration, when the resistor R1 is normally connected to the external terminal T1 and high-level signals are output from the terminal voltage detecting circuit 3, the PMOS transistor M11 is turned off and switched to a cutoff state, and the PMOS transistor M3 is turned on and is switched to a conductive state. Accordingly, the output current iout output from the PMOS transistor M2 is supplied to the oscillating circuit 4, and the oscillating circuit 4 performs a normal oscillating operation.

Conversely, low-level signals are output from the terminal voltage detecting circuit 3 when the connection between the external terminal T1 and the resistor R1 is cut off, or when the connection between the resistor R1 and the ground voltage Vss is cut off, or when the external terminal T1 short-circuits to the ground voltage Vss. In any of these cases, the PMOS transistor M11 is turned on and the PMOS transistor M3 is turned off. Thus, the oscillating circuit 4 stops oscillating and high-level signals are output from the output terminal, and the current generating circuit 2a stops outputting the output current iout.

Accordingly, the semiconductor device 1a according to the second embodiment of the present invention causes the oscillating circuit 4 to stop operating and causes the current generating circuit 2a to stop outputting the output current iout in the event that the resistor R1 is disconnected from the external terminal T1 or when the external terminal T1 short-circuits to the ground voltage Vss. Therefore, the same effects as those of the first embodiment can be attained. Furthermore, as the output current iout is prevented from being output, the current can be prevented from increasing, and the current consumption can be reduced.

Third Embodiment

In the second embodiment, low-level signals are output from the terminal voltage detecting circuit 3 when the connection between the external terminal T1 and the resistor R1 is cut off, or when the connection between the resistor R1 and the ground voltage Vss is cut off, or when the external terminal T1 short-circuits to the ground voltage Vss, so that the output current iout is prevented from being output from the current generating circuit 2a. In another configuration, when low-level signals are output from the terminal voltage detecting circuit 3, the output current iout can be prevented from being output from the PMOS transistor M2, and a current that has been generated by another circuit, regardless of the state of the resistor R1, can be supplied to the oscillating circuit 4. A third embodiment of the present invention has such a configuration.

Figure 6:
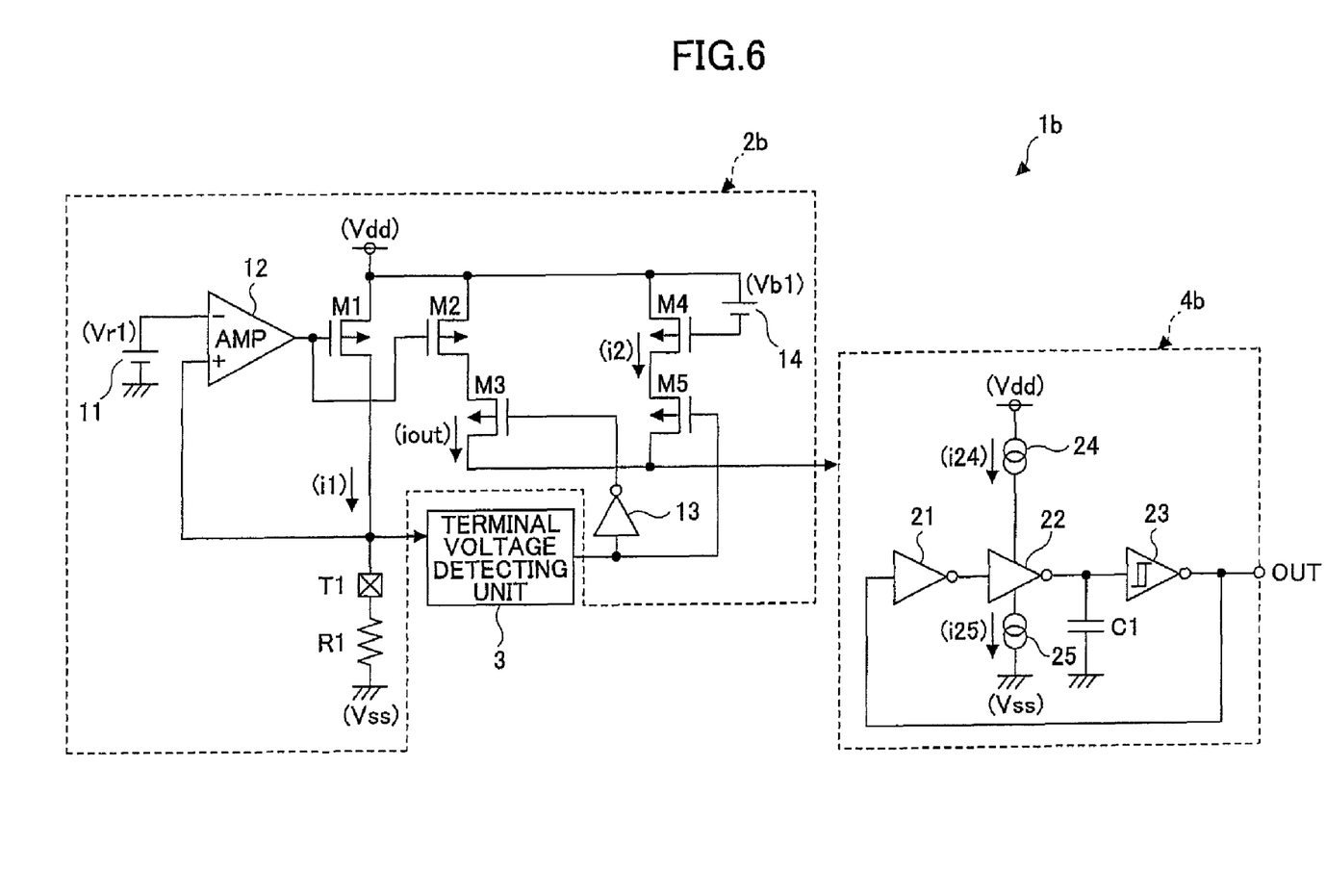
FIG. 6 illustrates a circuit example of a semiconductor device according to a third embodiment of the present invention.

FIG. 6 illustrates a circuit example of a semiconductor device according to the third embodiment of the present invention. In FIG. 6, elements corresponding to those in FIG. 5 are denoted by the same reference numbers, and are not further described. Only the differences between FIGS. 5 and 6 are described.

The differences between FIGS. 5 and 6 are that in FIG. 6, the current generating circuit 2a is additionally provided with PMOS transistors M4 and M5 and a bias power source 14, and the PMOS transistor M11 is eliminated from the oscillating circuit 4. Therefore, the current generating circuit 2a shown in FIG. 5 is changed to a current generating circuit 2b in FIG. 6, the oscillating circuit 4 shown in FIG. 5 is changed to an oscillating circuit 4b in FIG. 6, and the semiconductor device 1a shown in FIG. 5 is changed to a semiconductor device 1b in FIG. 6.

The semiconductor device 1b shown in FIG. 6 includes the current generating circuit 2b for generating a current to be used inside the semiconductor device 1b constituting an IC and outputting the generated current as the output current iout; the terminal voltage detecting circuit 3; and the oscillating circuit 4b to which the output current iout is supplied, constituting a load circuit of the current generating circuit 2b. The current generating circuit 2b constitutes a current generating circuit unit, and the oscillating circuit 4b constitutes a load circuit unit.

The current generating circuit 2b includes the first reference voltage generating circuit 11, the operational amplifying circuit 12, the inverter 13, the bias power source 14 for generating a predetermined bias voltage Vb1, the PMOS transistors M1 through M5, and the resistor R1. The resistor R1 is externally connected to the semiconductor device 1b.

In the current generating circuit 2b, a series circuit of the PMOS transistors M4 and M5 is connected in parallel with a series circuit of the PMOS transistors M2 and M3, and output signals from the terminal voltage detecting circuit 3 are input to the gate of the PMOS transistor M5. The bias voltage Vb1 is input to the gate of the PMOS transistor M4, and the PMOS transistor M4 constitutes a constant current source for supplying a constant current i2.

The oscillating circuit 4b includes the inverters 21 and 22, the hysteresis inverter 23, the current sources 24 and 25, and the capacitor C1. The PMOS transistor M11 is eliminated from the oscillating circuit 4b, but otherwise the oscillating circuit 4b has the same configuration as that of the oscillating circuit 4 shown in FIG. 5.

In such a configuration, when the resistor R1 is normally connected to the external terminal T1 and high-level signals are output from the terminal voltage detecting circuit 3, the PMOS transistor M3 is turned on and switched to a conductive state and the PMOS transistor M5 is turned off and switched to a cutoff state. Therefore, the output current iout output from the PMOS transistor M2 is supplied to the oscillating circuit 4b, and the oscillating circuit 4b performs a normal oscillating operation.

Conversely, low-level signals are output from the terminal voltage detecting circuit 3 when the connection between the external terminal T1 and the resistor R1 is cut off, or when the connection between the resistor R1 and the ground voltage Vss is cut off, or when the external terminal T1 short-circuits to the ground voltage Vss. In any of these cases, the PMOS transistor M3 is turned off and switched to a cutoff state, and the PMOS transistor M5 is turned on and switched to a conductive state. Thus, the current generating circuit 2b supplies, to the oscillating circuit 4b, the constant current i2 output from the PMOS transistor M4, and the oscillating circuit 4b oscillates at a frequency determined by the constant current i2.

Accordingly, in the semiconductor device 1b according to the third embodiment of the present invention, in the event that the resistor R1 is disconnected from the external terminal T1 or when the external terminal T1 short-circuits to the ground voltage Vss, the terminal voltage detecting circuit 3 can prevent the oscillating circuit 4b from performing unspecified operations which may lead to damages in the oscillating circuit 4b or other circuits, and can also cause the oscillating circuit 4b to oscillate at a predetermined frequency without stopping.

Fourth Embodiment

The terminal voltage detecting circuit 3 may be configured to output two different types of signals, i.e., high-voltage detection output signals and low-voltage detection output signals, for the purpose of performing different processes when the voltage of the external terminal T1 is low and when the voltage of the external terminal T1 is high. A fourth embodiment of the present invention has such a configuration.

Figure 7:
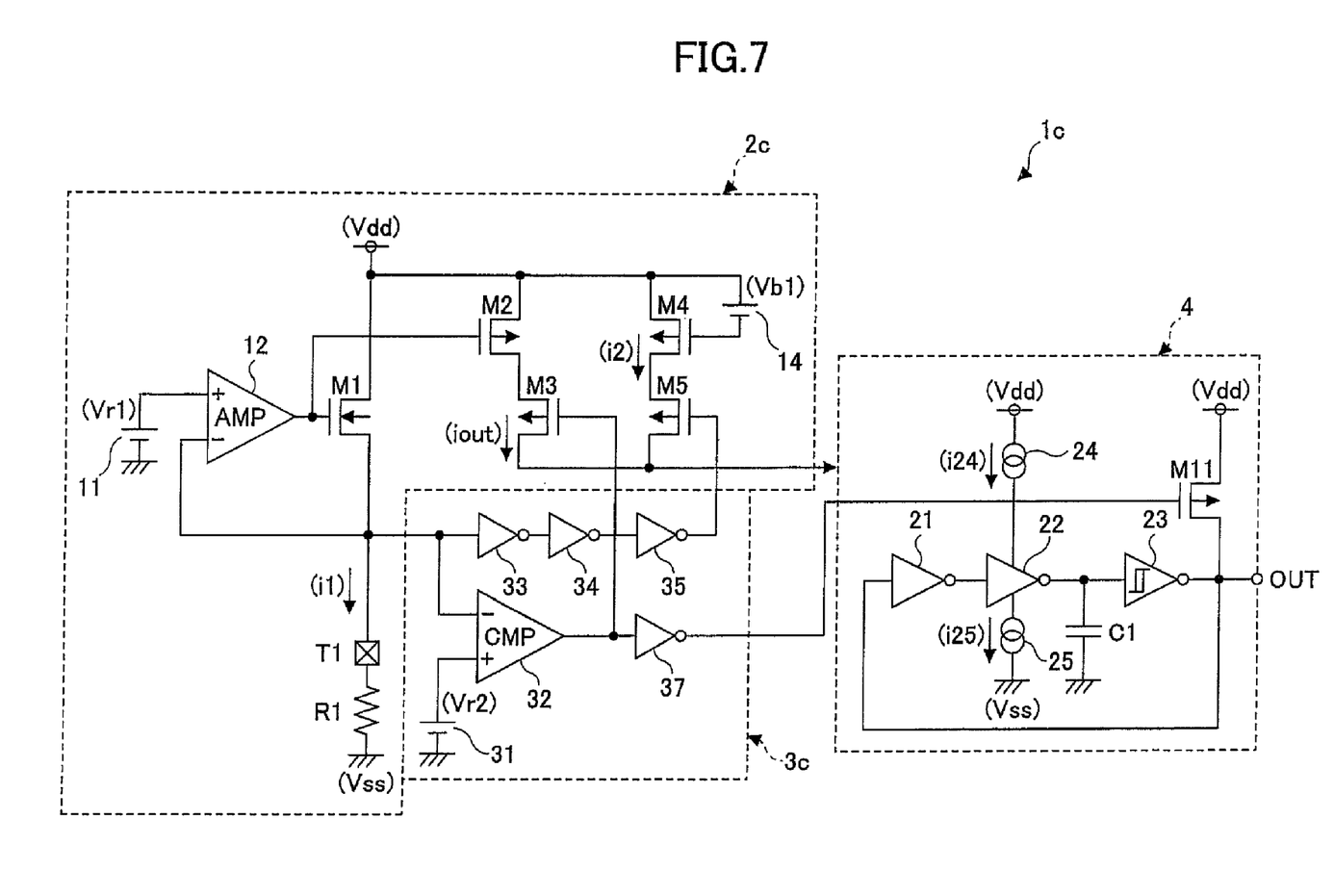
FIG. 7 illustrates a circuit example of a semiconductor device according to a fourth embodiment of the present invention.

FIG. 7 illustrates a circuit example of a semiconductor device according to the fourth embodiment of the present invention. In FIG. 7, elements corresponding to those in FIG. 4 or 6 are denoted by the same reference numbers, and are not further described. Only the differences between FIGS. 6 and 7 are described.

The differences between FIGS. 6 and 7 are that in FIG. 7, the inverter 13 is eliminated from the current generating circuit 2b shown in FIG. 6; the PMOS transistor M1 shown in FIG. 6 is replaced with an NMOS transistor; the inverting input terminal and the noninverting input terminal of the operational amplifying circuit 12 are interchanged; the AND circuit 36 of the terminal voltage detecting circuit 3 shown in FIG. 4 is eliminated from the terminal voltage detecting circuit 3 shown in FIG. 6; an inverter 37 is additionally provided to the terminal voltage detecting circuit 3 shown in FIG. 6; the inverting input terminal and the noninverting input terminal of the comparator 32 are interchanged; and the oscillating circuit 4b shown in FIG. 6 is replaced with the oscillating circuit 4. Therefore, the current generating circuit 2b shown in FIG. 6 is changed to a current generating circuit 2c in FIG. 7, the terminal voltage detecting circuit 3 shown in FIG. 6 is changed to a terminal voltage detecting circuit 3c in FIG. 7, and the semiconductor device 1b shown in FIG. 6 is changed to a semiconductor device 1c in FIG. 7.

The semiconductor device 1c shown in FIG. 7 includes the current generating circuit 2c for generating a current to be used inside the semiconductor device 1c constituting an IC and outputting the generated current as the output current iout; the terminal voltage detecting circuit 3c; and the oscillating circuit 4 to which the output current iout is supplied, constituting a load circuit of the current generating circuit 2c. The current generating circuit 22c constitutes a current generating circuit unit, and the terminal voltage detecting circuit 3c constitutes a terminal voltage detecting circuit unit.

The current generating circuit 2c includes the first reference voltage generating circuit 11, the operational amplifying circuit 12, the bias power source 14, the NMOS transistor M1, the PMOS transistors M2 through M5, and the resistor R1. The resistor R1 is externally connected to the semiconductor device 1c.

The terminal voltage detecting circuit 3c includes the second reference voltage generating circuit 31, the comparator 32, and the inverters 33 through 35 and 37.

The inverters 33 through 35 are connected in series between the external terminal T1 and the gate of the PMOS transistor M5, and the inverting input terminal of the comparator 32 is connected to the external terminal T1. The second reference voltage Vr2 is input to the noninverting input terminal of the comparator 32. The output terminal of the comparator 32 is connected to the gate of the PMOS transistor M3, and to the gate of the PMOS transistor M11 through the inverter 37.

In such a configuration, a circuit including the inverters 33 through 35 is for detecting the high voltage side; and a circuit including the second reference voltage generating circuit 31, the comparator 32, and the inverter 37 is for detecting the low voltage side.

When the resistor R1 is normally connected between the external terminal T1 and the ground voltage Vss, the input terminal of the inverter 33 is low-level, and therefore the output terminal of the inverter 33 is high-level. Accordingly, the output terminal of the inverter 35 becomes high-level, and the PMOS transistor M5 is turned off and switched to a cutoff state, so that the constant current i2 is prevented from being output to the oscillating circuit 4. Furthermore, the output signals of the comparator 32 become low-level, and therefore the PMOS transistor M3 is turned on and switched to a conductive state, so that the output current iout is supplied to the oscillating circuit 4. At the same time, the output signals from the inverter 37 become high-level, and therefore the PMOS transistor M11 is turned off and switched to a cutoff state, and the oscillating circuit 4 oscillates at a frequency according to the output current iout.

Conversely, when the connection between the external terminal T1 and the resistor R1 is cut off, or the connection between the resistor R1 and the ground voltage Vss is cut off, the input terminal of the inverter 33 becomes high-level, and therefore the output terminal of the inverter 35 becomes low-level so that the PMOS transistor M5 is turned on, and the constant current i2 is supplied to the oscillating circuit 4. At the same time, the output signals from the comparator 32 are maintained at a low level, and therefore the PMOS transistor M3 is turned on. However, if the connection between the external terminal T1 and the resistor R1 is cut off, the current does not flow to the NMOS transistor M1, and therefore the output current iout is also prevented from being output. Accordingly, the oscillating circuit 4 oscillates at a predetermined frequency according to the constant current i2.

Furthermore, when the external terminal T1 short-circuits to the ground voltage Vss, the input terminal of the inverter 33 becomes low-level, and the output terminal of the inverter 35 becomes high-level. Therefore, the PMOS transistor M5 is turned off, and the constant current i2 is prevented from being supplied to the oscillating circuit 4. At the same time, the output signals from the comparator 32 become high-level, and therefore the PMOS transistor M3 is also turned off, and the output current iout is also prevented from being supplied to the oscillating circuit 4. Furthermore, the output signals from the inverter 37 become low-level, and therefore the PMOS transistor M11 is turned on and the oscillating circuit 4 stops oscillating and outputs high-level signals.

Accordingly, in the semiconductor device 1c according to the fourth embodiment of the present invention, when the resistor R1 is not connected to the external terminal T1, the constant current i2 is supplied to the oscillating circuit 4 to cause the oscillating circuit 4 to oscillate. When the external terminal T1 short-circuits to the ground voltage Vss, the output current iout is prevented from being output, so that a large current is not supplied to the oscillating circuit 4, and the oscillating circuit 4 stops operating. Accordingly, measures can be taken against abnormal states of the external terminal T1, thereby more reliably preventing the circuit from overheating and preventing failures in the load circuit to which the current is supplied.

In the first through fourth embodiments of the present invention, an oscillating circuit is taken as an example of the load circuit of the current generating circuit. However, this is merely an example. The present invention is also applicable to a case of supplying a current from the current generating circuit to a load circuit other than an oscillating circuit.

The present invention is not limited to the specifically disclosed embodiment, and variations and modifications may be made without departing from the scope of the present invention.

The present application is based on Japanese Priority Patent Application No. 2008-170033, filed on Jun. 30, 2008, the entire contents of which are hereby incorporated herein by reference.

What is claimed is:

1. A semiconductor device comprising:
a current generating circuit unit configured to generate and output an output current according to a resistance of a resistor connected to a predetermined external terminal;
a load circuit unit to which the output current from the current generating circuit is supplied; and
a terminal voltage detecting circuit unit configured to detect a connection state between the external terminal and the resistor based on a voltage of the external terminal, and output a signal according to a result of the detection, wherein:
the current generating circuit unit controls another current supplied to the resistor through the external terminal and controls the output current, so that the voltage of the external terminal corresponds to a predetermined first reference voltage; and
the terminal voltage detecting circuit unit detects whether a voltage difference between the voltage of the external terminal and the first reference voltage is less than or equal to a predetermined value, and stops an operation of the load circuit unit in the event that the voltage difference exceeds the predetermined value.

2. The semiconductor device according to claim 1, wherein:
the terminal voltage detecting circuit unit detects whether the voltage of the external terminal is less than or equal to a predetermined second reference voltage which is lower than the first reference voltage, to detect whether the voltage difference between the voltage of the external terminal and the first reference voltage exceeds the predetermined value.

3. The semiconductor device according to claim 1, wherein:
the terminal voltage detecting circuit unit detects whether the voltage of the external terminal is greater than or equal to a predetermined third reference voltage which is higher than the first reference voltage, to detect whether the voltage difference between the voltage of the external terminal and the first reference voltage exceeds the predetermined value.

4. The semiconductor device according to claim 1, wherein:
the load circuit unit is an oscillating circuit configured to generate and output signals having a frequency according to the output current supplied from the current generating circuit unit.

5. The semiconductor device according to claim 1, wherein:
in the event that the terminal voltage detecting circuit unit detects that the voltage difference between the voltage of the external terminal and the first reference voltage exceeds the predetermined value, the current generating circuit unit stops supplying the output current to the load circuit unit.

6. The semiconductor device according to claim 5, wherein:
the current generating circuit unit comprises a constant current source configured to generate and output a predetermined constant current; and
in the event that the terminal voltage detecting circuit unit detects that the voltage difference between the voltage of the external terminal and the first reference voltage exceeds the predetermined value, the current generating circuit unit stops outputting the output current and supplies the constant current from the constant current source to the load circuit unit.

7. The semiconductor device according to claim 5, wherein:
the terminal voltage detecting circuit unit detects whether the voltage of the external terminal is less than or equal to a predetermined second reference voltage which is lower than the first reference voltage, to detect whether the voltage difference between the voltage of the external terminal and the first reference voltage exceeds the predetermined value.

8. The semiconductor device according to claim 5, wherein:

the terminal voltage detecting circuit unit detects whether the voltage of the external terminal is greater than or equal to a predetermined third reference voltage which is higher than the first reference voltage, to detect whether the voltage difference between the voltage of the external terminal and the first reference voltage exceeds the predetermined value.

9. The semiconductor device according to claim 5, wherein:
the load circuit unit is an oscillating circuit configured to generate and output signals having a frequency according to the output current supplied from the current generating circuit unit.

10. A semiconductor device comprising:
a current generating circuit unit configured to generate and output an output current according to a resistance of a resistor connected to a predetermined external terminal;
a load circuit unit to which the output current from the current generating circuit is supplied; and
a terminal voltage detecting circuit unit configured to detect a connection state between the external terminal and the resistor based on a voltage of the external terminal, and output a signal according to a result of the detection, wherein:
the current generating circuit unit controls another current supplied to the resistor through the external terminal and controls the output current, so that the voltage of the external terminal corresponds to a predetermined first reference voltage; and
the terminal voltage detecting circuit unit detects whether a voltage difference between the voltage of the external terminal and the first reference voltage is less than or equal to a predetermined value, and in the event that the terminal voltage detecting circuit unit detects that the voltage difference between the voltage of the external terminal and the first reference voltage exceeds the predetermined value, the current generating circuit unit stops supplying the output current to the load circuit unit.

11. The semiconductor device according to claim 10, wherein:
the current generating circuit unit comprises a constant current source configured to generate and output a predetermined constant current; and
in the event that the terminal voltage detecting circuit unit detects that the voltage difference between the voltage of the external terminal and the first reference voltage exceeds the predetermined value, the current generating circuit unit stops outputting the output current and supplies the constant current from the constant current source to the load circuit unit.

12. The semiconductor device according to claim 10, wherein:
the terminal voltage detecting circuit unit detects whether the voltage of the external terminal is less than or equal to a predetermined second reference voltage which is lower than the first reference voltage, to detect whether the voltage difference between the voltage of the external terminal and the first reference voltage exceeds the predetermined value.

13. The semiconductor device according to claim 10, wherein:
the terminal voltage detecting circuit unit detects whether the voltage of the external terminal is greater than or equal to a predetermined third reference voltage which is higher than the first reference voltage, to detect whether the voltage difference between the voltage of the external terminal and the first reference voltage exceeds the predetermined value.

14. The semiconductor device according to claim 10, wherein:
the load circuit unit is an oscillating circuit configured to generate and output signals having a frequency according to the output current supplied from the current generating circuit unit.

* * * * *